United States Patent [19]

Tracey et al.

[11] Patent Number: 4,794,324
[45] Date of Patent: Dec. 27, 1988

[54] METHOD AND APPARATUS FOR CHARACTERIZING A BROAD SPECTRUM SIGNAL

[75] Inventors: Joseph F. Tracey, Owings Mills; David G. Weifenbach, Reisterstown; Mitchell D. Turner, Baltimore, all of Md.

[73] Assignee: Westinghouse Electric Corp., Pittsburgh, Pa.

[21] Appl. No.: 902,809

[22] Filed: Sep. 2, 1986

[51] Int. Cl.⁴ ............................................. G01R 23/16
[52] U.S. Cl. ................................. 324/77 A; 324/77 B
[58] Field of Search ............... 324/77 R, 78 R, 78 D, 324/78 Z, 79 R, 79 D, 83 R, 83 A, 83 D, 77 A, 77 B

[56] References Cited

U.S. PATENT DOCUMENTS 3,510,440  4/1985  Ryder ............................. 324/77 R
3,961,255  6/1976  Hekimian ........................ 324/83 R
3,975,678  8/1976  Erickson ......................... 324/79 D
4,142,177  2/1979  Davis ............................. 324/78 D
4,156,183  5/1979  Schuon ........................... 324/77 A
4,420,699  12/1983 Schmitt ........................... 324/83 A
4,547,726  10/1985 Premerlani ...................... 324/78 Z
4,547,727  10/1985 Tsui et al. ....................... 324/77 R Primary Examiner—Michael J. Tokar
Attorney, Agent, or Firm—W. G. Sutcliff

[57] ABSTRACT

A method for characterizing a broad spectrum signal provides improved performance on high-noise, sloped, high variation signals by calculating separate low and high frequency average signal levels and determining low and high frequency bandwidth limits referenced to the low and high frequency average signal levels respectively. The method may be practiced using a computer system interfaced to a programmable spectrum analyzer.

12 Claims, 6 Drawing Sheets

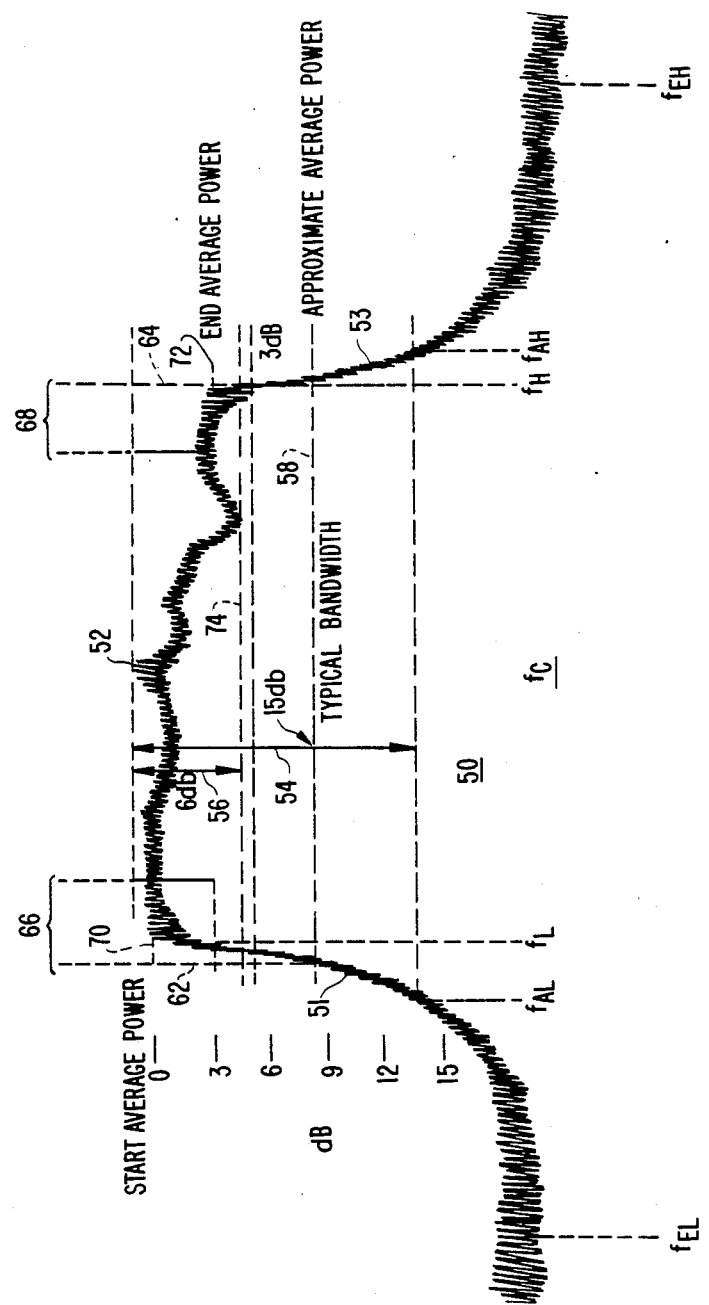

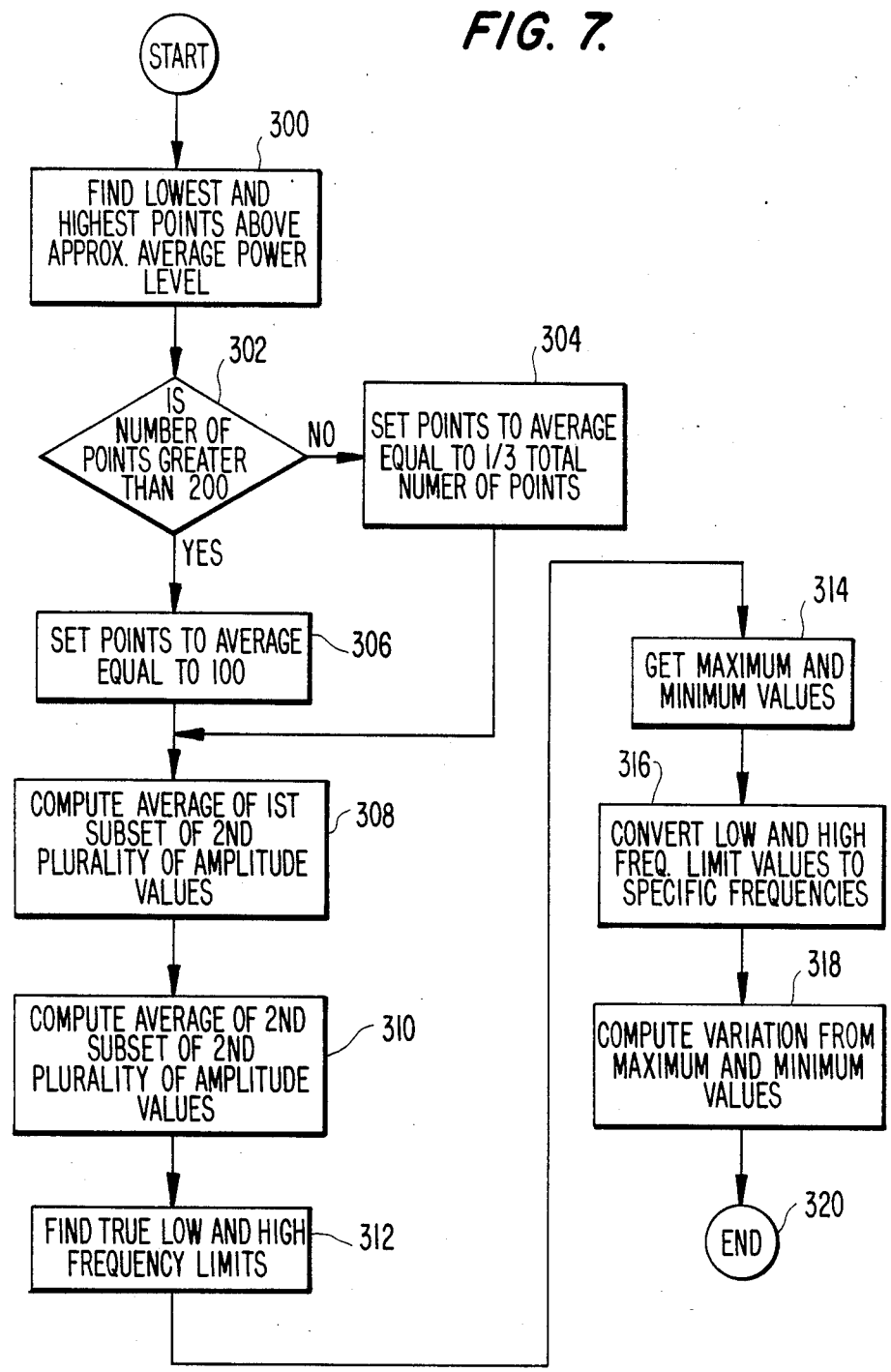

METHOD AND APPARATUS FOR CHARACTERIZING A BROAD SPECTRUM SIGNAL

GOVERNMENT RIGHTS

The United States Government has rights in this invention which was made under Contract No. N0019-81-C-0369.

BACKGROUND OF THE INVENTION

The invention relates generally to signal analysis and, more particularly, to obtaining descriptive parameters for broad spectrum signals.

It is often desirable in the electronic communications art to measure and describe the parameters of a broad spectrum signal. Such measurements and description are particularly useful in the field of electronic countermeasures (ECM). Signals having a relatively constant amplitude over a well defined bandwidth and being relatively free from noise are relatively easy to characterize using a three decibel (dB) bandwidth definition. However, it is often desirable to characterize broad spectrum signals occurring in the presence of high noise levels, and broad spectrum signals which exhibit considerable variation. Such signals are much more difficult to characterize using prior art automatic methods and apparatus, which are often confused by high signal peaks or noise peaks. Moreover, where a signal exhibits a "slant", characterizing the signal in terms of upper and lower frequency levels defined by a 3 dB limit can be misleading. Therefore, manual methods of describing such signals have previously been required. That is, the characteristics of the signal have required measurement by visual estimation. Such prior art methods did not provide noise spectrum bandwidth measurements having the reliability and repeatability which is required for applications such as ECM system production testing.

It is therefore an object of the present invention to provide a method and apparatus for characterizing broad spectrum signals existing in high noise environments and which exhibit varying characteristics.

It is a further object of the invention to provide such a method which is both reliable and repeatable.

It is yet a further object of the invention to provide methods and apparatus for characterizing broad spectrum signals existing in high noise environments and exhibiting widely varying characteristics which can rapidly and economically provide the required measurements in a production environment.

SUMMARY OF THE INVENTION

To achieve the foregoing objects, and in accordance with the purpose of the invention embodied and broadly described herein, the invention in one aspect provides a method for analyzing the bandwidth of a broad spectrum signal. The method comprises the steps of estimating the high frequency limit and low frequency limit of the signal and obtaining a first plurality of amplitude values of the signal at frequencies extending from below the estimated low frequency limit to above the estimated high frequency limit. The method includes the further steps of determining approximate low and high frequency limits of the signal from the first plurality of amplitude values and obtaining a second plurality of amplitude values of the signal at frequencies extending from the approximate low frequency limit to the approximate high frequency limit. The method further includes the step of averaging the amplitude of a first subset of the second plurality of amplitude values to obtain a first average signal level and averaging the amplitudes of a second subset of the second plurality of amplitude values to obtain a second average signal level. Finally, the method includes the steps of determining a first true frequency limit of the signal equal to the frequency of one of the second plurality of amplitude values, the amplitude of which bears a predetermined relation with the first frequency average signal level, and determining a second true frequency limit of the signal equal to the frequency of one of the second plurality of amplitude values, the amplitude of which bears a predetermined relationship with the second frequency average signal level.

In a second aspect, the invention provides apparatus for analyzing a broad spectrum signal, comprising means for obtaining amplitude values of a plurality of components of the signal across the frequency range thereof, means for obtaining approximate high and low frequency limit values of the signal, means for averaging the amplitude values of the first subset of the components of the signal extending upward in frequency from the approximate low frequency limit of the signal to obtain a low frequency average signal level and for averaging the amplitude values of a second subset of the components extending downward in frequency from the approximate high frequency limit of the signal to obtain a high frequency average signal level, and means for determining a true low frequency limit of the signal equal to the frequency of the lowest frequency one of the amplitude values, the amplitude of which is no more than a predetermined amount below the low frequency average signal level and for determining a true high frequency limit of the signal equal to the frequency of the highest frequency one of the plurality of amplitude values the amplitude of which is no more than the predetermined amount below the high frequency average signal level.

BRIEF DESCRIPTION OF THE DRAWINGS

FIG. 2 is an illustration similar to FIG. 1 of a broad spectrum signal of the type measured in accordance with the present invention, exhibiting higher noise characteristics and wider variation than the signal shown in FIG. 1;

FIGS. 4 through 7 are logic flow charts illustrating the logic of software for implementing a preferred embodiment of the present invention.

DESCRIPTION OF THE PREFERRED EMBODIMENT

Figure 1:
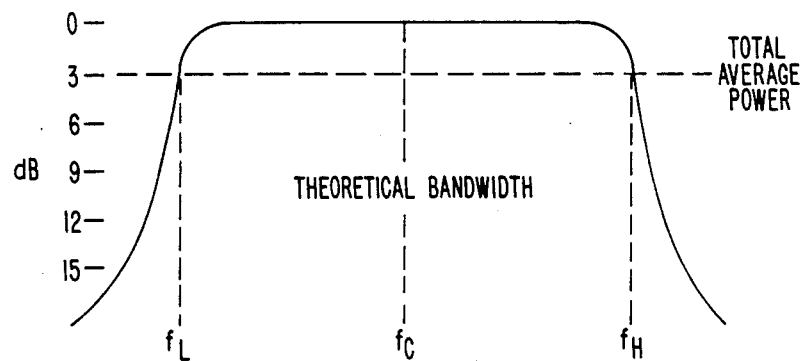
FIG. 1 is a frequency domain illustration of a relatively invariant noise-free broad spectrum signal of the type measured in accordance with the present invention.

Referring now to the drawings, FIG. 1 shows a signal having a relatively constant amplitude over a well defined bandwidth and being relatively free from noise. Such signals are generally characterized by a center frequency $f_C$, a low frequency limit $f_L$, and a high frequency limit $f_H$. The lower and upper frequency limits $f_L$ and $f_H$ are often defined as points on the skirts of the signal which are a predetermined level below the peak level. In FIG. 1, it can be seen that frequency limits $f_L$ and $f_H$ are defined as those portions on the skirts of the signal which are three decibels (dB) below the highest level of the signal. By definition, the 3 dB level is equal to the fifty percent level power of the signal.

FIG. 2 shows a high-noise signal exhibiting a large variation, and a slanted mid-portion. The present invention is particularly suitable for characterizing signals of the type shown in FIG. 2.

Figure 3:
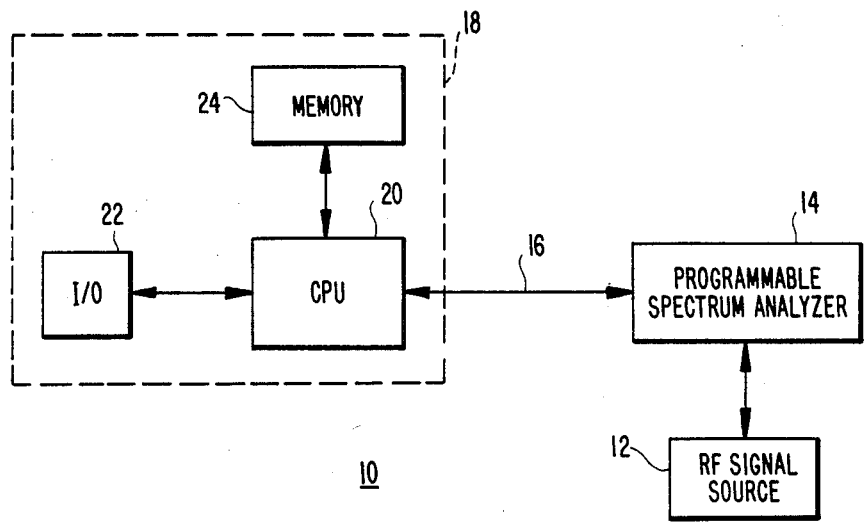
FIG. 3 is a block diagram of a preferred embodiment of the present invention.

FIG. 3 shows a system 10 for obtaining descriptive parameters of a broad spectrum radio frequency (RF) signal, such as provided by a source 12, which constitutes a preferred embodiment of the present invention. System 10 includes a programmable spectrum analyzer 14 connected over an interface bus 16 to a computer system 18. Computer system 18 includes a central processing unit (CPU) 20 and input/output apparatus 22. Input/output apparatus 22 may comprise devices such as a CRT output display device, a keyboard, and/or a printer. Computer system 18 may also include a device 24 providing additional memory storage.

Spectrum analyzer 14 may comprise, for example, a Hewlett Packard model HP8566 programmable spectrum analyzer. Bus 16 may comprise, for example, an IEEE 488 interface bus, and computer system 18 may comprise a Hewlett Packard model HP9836 computer system.

In operation, source 12 provides a signal to spectrum analyzer 14 for analysis. This analysis is performed by spectrum analyzer 14 under control of computer system 18, using commands transmitted over bus 16. Characteristics of the signal determined by spectrum analyzer 14 are then transmitted over bus 16 to computer system 18 where further analysis is performed to provide descriptive parameters of the signal supplied by source 12.

The basic operation of spectrum analyzer 14 is well known to those skilled in the art and will not be described herein in great detail. Briefly, spectrum analyzer 14 obtains a plurality of amplitude measurements of the signal supplied by source 12 at different frequencies over a frequency interval defined by frequency limits supplied from computer system 18. These amplitude values are temporarily stored in spectrum analyzer 14 and may be displayed on an output device integral with spectrum analyzer 14 or transferred to computer system 18 in response to commands from computer system 18. A more complete description of the construction and operation of the Hewlett Packard HP8566 programmable spectrum analyzer is contained in the 8566A SPECTRUM ANALYZER REMOTE OPERATION, manual (part No. 08566-90003) available from the Hewlett Packard Corporation. Similarly, more complete descriptions of the construction and operation of the Hewlett Packard HP9836 computer system and IEEE 488 interface bus are contained in Tutoral Description of Hewlett Packard Bus Interface also available from the Hewlett Packard Corporation. The disclosures of these documents are hereby expressly incorporated by reference.

Figure 4:
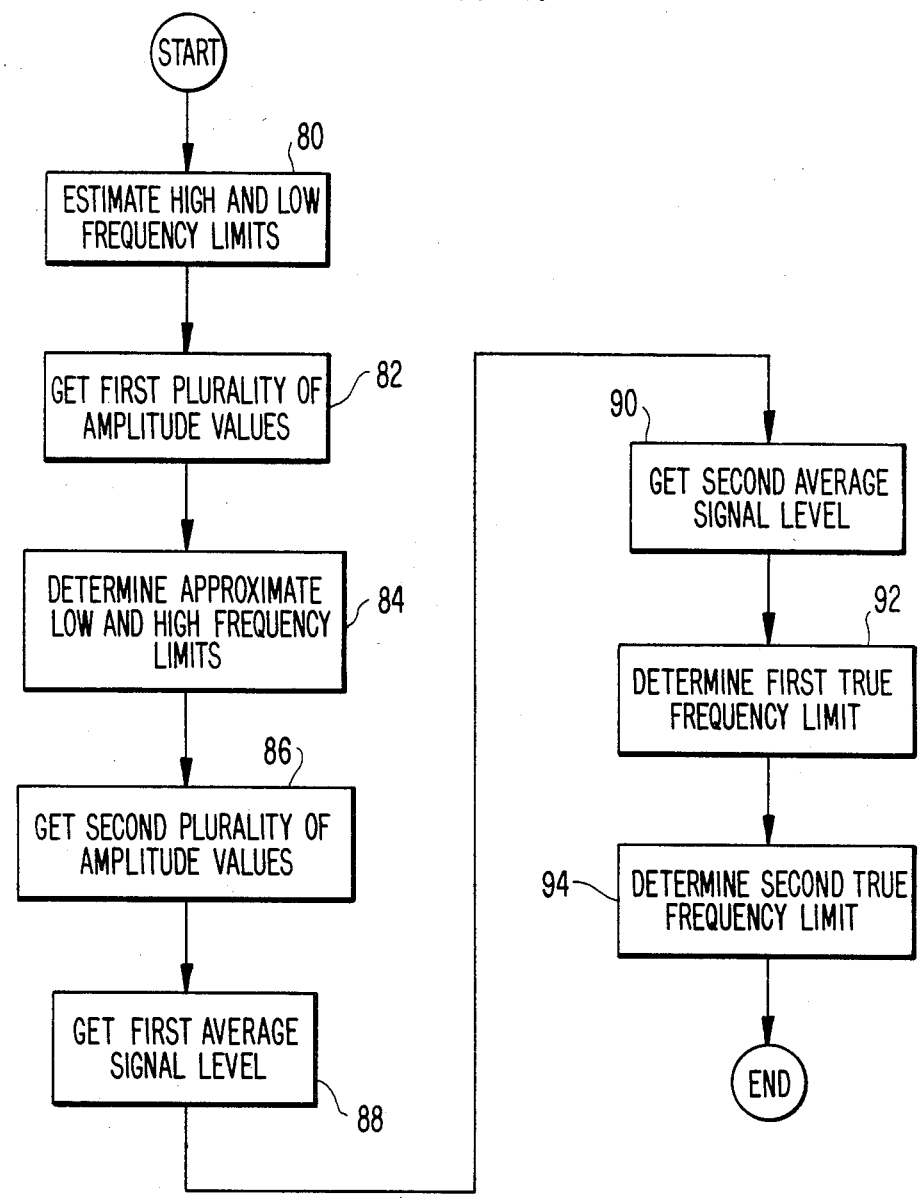

In accordance with a preferred embodiment of the present invention, the apparatus shown in FIG. 3 may be used to perform a method for analyzing the bandwidth of a broad spectrum signal as shown in FIG. 4. The method includes a first step 80 of estimating the high frequency limit and low frequency limit of the signal. This information is entered by an operator into computer system 18. At 82, a first plurality of amplitude values of the signal are obtained at frequencies extending from below the estimated low frequency limit to above the estimated high frequency limit. Approximate low and high frequency limits of the signal are then determined at 84 from the first plurality of amplitude values. At 86, a second plurality of amplitude values of the signal are obtained at frequencies extending from the approximately low frequency limit to the approximately high frequency limit.

The amplitudes of a first subset of the second plurality of amplitude values are averaged at 88 to obtain a first average signal level. Similarly at 90, the amplitudes of a second subset of the second plurality of amplitude values are averaged to obtain a second average signal level. The next step 92 in the method of the preferred embodiment is determining a first true frequency limit of the signal which is equal to the frequency of one of the second plurality of amplitude values, the amplitude of which bears a predetermined relation with the first average signal level. Finally, at 94, a second true frequency limit of the signal is determined which is equal to the frequency of one of the second plurality of amplitude values, the amplitude of which bears a predetermined relationship with the second average signal level.

Referring once again to FIG. 2, there is shown a broad spectrum signal 50 having upper and lower skirts 51, 53 which exhibits a variation in signal strength and a high noise level. In order to characterize signal 50 according to the principles of the present invention, a center frequency and bandwidth of the signal 50 are estimated. Alternatively, and equivalently, an estimated low frequency limit $f_{EL}$ and an estimated high frequency limit $f_{EH}$ are determined. Estimated limits $f_{EL}$ and $f_{EH}$ may be entered by an operator into computer system 18. Computer system 18 multiplies these estimated limits by an expansion factor to obtain an expanded low frequency limit value below the estimated low frequency limit value and an expanded high frequency limit value higher than the estimated high frequency limit value. These expanded limit values are then transmitted as start and stop frequencies to spectrum analyzer 14. Spectrum analyzer 14 then obtains a plurality of amplitude values of signal 50 beginning at the start frequency below estimated low frequency limit $f_{EL}$ and ending at the stop frequency above estimated upper frequency limit $f_{EH}$. The peak amplitude value 52 is determined and stored by spectrum analyzer 14 and an approximate bandwidth is determined defined by an approximate low frequency limit $f_{AL}$ and an approximate high frequency limit $f_{AH}$. If the signal to noise ratio of signal 50 is greater than 20 dB, $f_{AL}$ and $f_{AL}$ are defined as 15 dB limits. Otherwise, approximate bandwidth limits $f_{AL}$ and $f_{AH}$ are defined using 6 dB limits. A 15 dB limit is indicated at 54, and a 6 dB limit indicated at 56. Since signal 50 exhibits a signal to noise ratio greater than 20 dB, the 15 dB definition 54 is utilized to establish approximate low and high frequency limits $f_{AL}$, $f_{AH}$, respectively. The approximate average power 58 of signal 50 between the approximate low and high frequency limits $f_{AL}$ and $f_{AH}$ is then determined.

Computer system 18 then commands spectrum analyzer 14 to obtain a second plurality of amplitude values of signal 50 at frequencies extending from the approximate low frequency limit $f_{AL}$ to the approximate high frequency limit $f_{AH}$.

Lower and upper subset end points 62, 64 of the second plurality of amplitude values are then determined. Lower subset end point 62 is the lowest frequency one of the second plurality of amplitude values which is equal to or greater than approximate average power level 58. Upper subset end point 64 is the highest frequency one of the second plurality of amplitude values which is equal to or greater than the approximate average power level 58.

The amplitudes of a first subset 66 of the second plurality of amplitude values are then averaged to obtain a first average signal level 70. First subset 66 extends upward in frequency from lower subset end point 62. A second subset 68 of the second plurality of amplitude values is then averaged to obtain a second average signal level 72. Second subset 68 extends downward in frequency from upper subset end point 64. The size of first and second subsets 66, 68 is determined by the total number of the second plurality of amplitude values which lie between lower and upper subset end points 62, 64. In the preferred embodiment, if the total number of such second plurality of amplitude values is greater than two hundred, then first and second subsets 66, 68 are each equal in size to one hundred amplitude values. If the total number of the second plurality of amplitude values between upper and lower subset end points 62, 64 is less than two hundred then the size of first and second subsets 66, 68 is equal to one-third of the total number of the second plurality of amplitude values between upper and lower subset end points 62, 64. Other sizes for first and second subsets 66, 68 may be used, according to the specific type of analysis being performed.

A true low frequency limit $f_L$ of signal 50 is then determined. The true low frequency limit is established as the lowest frequency one of first subset 66 which is equal to or greater than a predetermined value below low frequency average signal level 70. In the preferred embodiment, true low frequency limit $f_L$ is defined as the lowest frequency one of first subset 66 which is 3 dB below the low frequency average signal level 70. Similarly, the true high frequency limit $f_H$ is defined as the highest frequency one of the second subset 68 having an amplitude equal to or greater than the high frequency average signal power 72, less 3 dB.

Maximum and minimum values 52, 74 of the second plurality of amplitudes lying between the true low and high frequency limits $f_L$, $f_H$ are then determined. The difference between such maximum and minimum values is stored as signal variation. With a flat signal, the variation of maximum and minimum amplitude values will be 3 dB for a 3 dB bandwidth signal. Values greater than 3 dB indicate a greater variation in the noise spectrum amplitude.

By determining true low and high frequency limits which are referenced to separate average power levels at the upper and lower frequency portions of signal 50, a more accurate characterization can be made of broad spectrum signals having a sloped bandwidth. Moreover, by adjusting appropriate parameters according to the signal to noise ratio of signal 50 a more accurate characterization of signal 50 can be made in the presence of noise.

Figure 5:
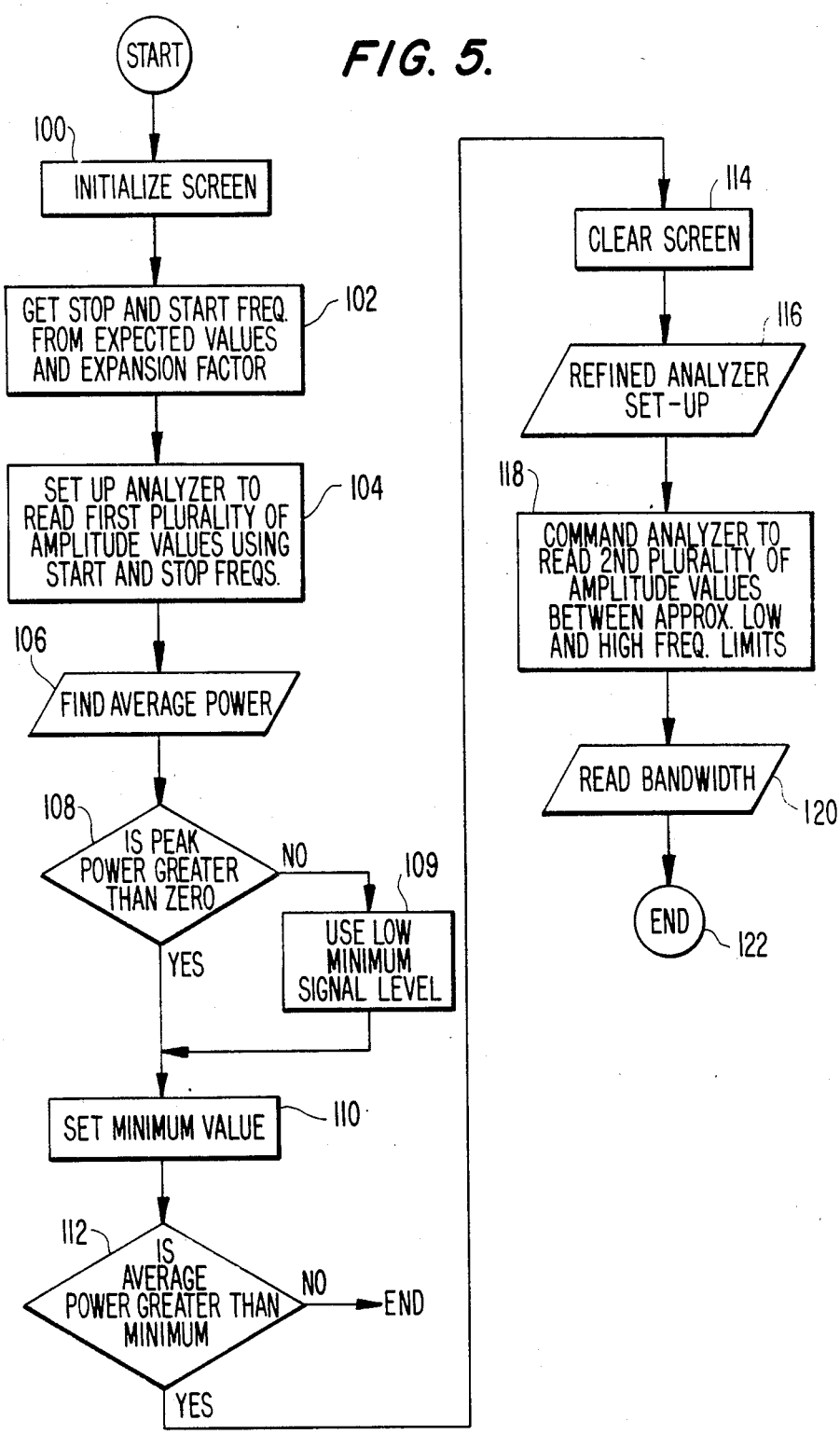
Figure 6:
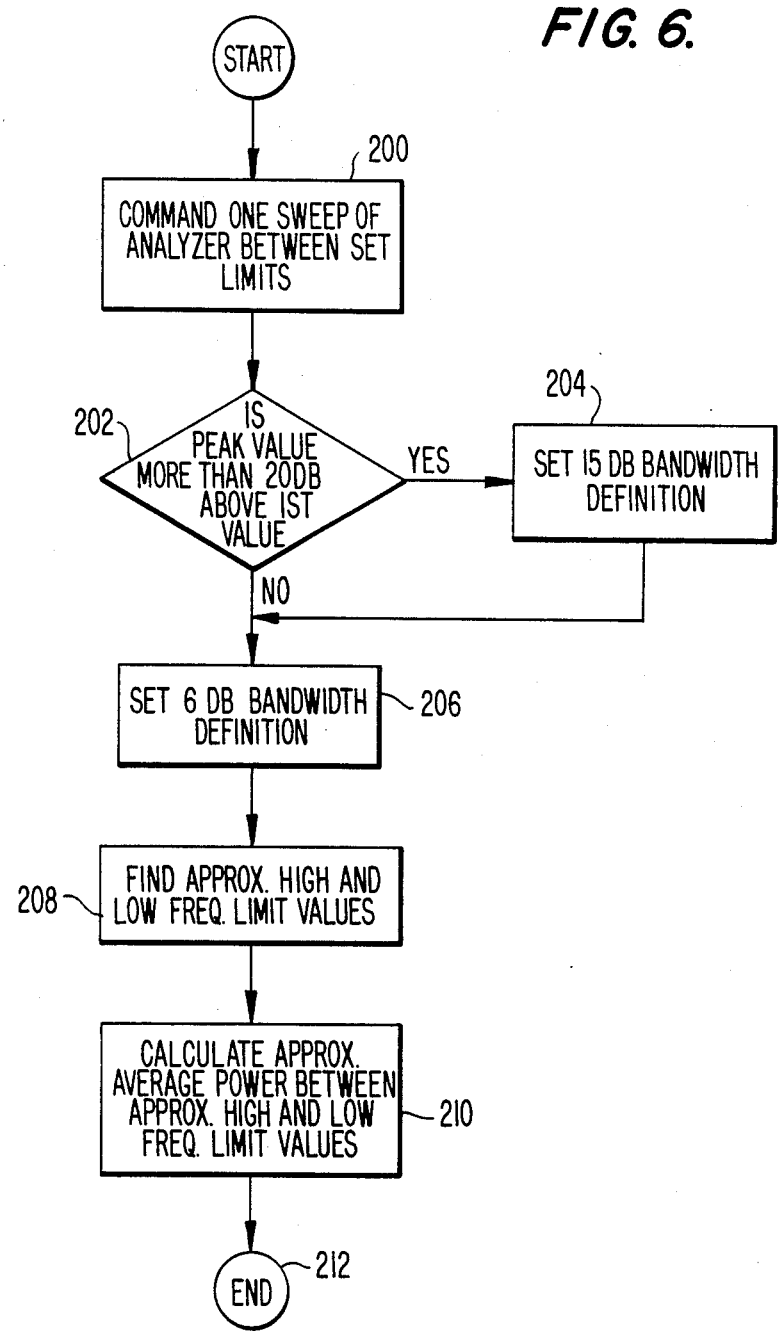

The logic flow of a computer program to implement the method shown in FIG. 4 described above using apparatus of FIG. 3 is shown in FIGS. 5-7.

Referring to FIG. 5 in conjunction with FIG. 2, computer system 18 at block 100 initializes the screen of I/O device 22. At block 102, the expected center frequency fc and expected bandwidth of signal 50 is determined from operator input and the expected bandwidth multiplied by an expansion factor to establish start and stop frequency limits for spectrum analyzer 14. Next, at block 104, spectrum analyzer 14 is set up to read data from signal 50 using start and stop frequency limits from block 102 to obtain a first plurality of amplitude values, and to transmit the first plurality of amplitude values over bus 16 to CPU 20.

At block 106, subroutine Find Average Power is entered. This subroutine, to be described later in greater detail, commands analyzer 14 to read the first plurality of amplitude values, determines the peak value 52 of the first plurality of amplitude values read in at block 104, determines approximate frequency limits $f_{AL}$, $f_{AH}$, and determines approximate average power 58 of signal 50 between limits $f_{AL}$ and $f_{AH}$.

At block 108, a determination is made as to whether peak value 52 is greater than zero dBm. If not, a low maximum signal level is set at block 109. At block 110 a minimum value is set and at block 112 a determination is made if approximate average power 58 determined from block 106 is greater than the predetermined minimum from block 110. If not, signal 50 is too weak to provide adequate analysis and the program terminates.

At block 114, the screen of I/O device 22 is cleared and subroutine Refined Analyzer Set Up is entered at block 116. In this subroutine, computer system 18 sends start frequency and stop frequency limits to spectrum analyzer 14 equal to approximate low and high frequency limits $f_{AL}$ and $f_{AH}$. A reference level for the analyzer is also transmitted based on peak power determined at block 106.

Analyzer 14 is then commanded at block 118 to scan signal 50 and obtain a second plurality of amplitude values between approximate low and high frequency limits $f_{AL}$ and $f_{AH}$. The second plurality of amplitude values are then transmitted to CPU 20 at block 120 for further analysis by subroutine Read Bandwidth. This subroutine finds true upper and lower frequency limits $f_L$ and $f_H$, respectively, and determines variation of signal 50 between these bandwidths. Program logic then terminates at block 122.

Referring now to FIG. 6 in conjunction with FIG. 2, there is shown a logic flow diagram of subroutine Find Average Power. At block 200, analyzer 14 is commanded to perform a single scan of signal 50 from source 12, find the peak value 52, and determine the amplitude of peak value 52, and transmit the peak amplitude value 52 to computer system 18. At block 202 a determination is made as to whether the difference between the peak value 52 and the lowest frequency one of the first plurality of amplitude values is greater than 20 dB. If so, a 15 dB definition is established for the approximate bandwidth. That is, the approximate bandwidth is defined as that portion of the signal which is no more than 15 dB below the peak value 52 of signal 50. If the difference between the peak value 52 and the lowest frequency one of the first plurality of amplitude values is less than 20 dB, then a 6 dB definition of approximate bandwidth is established, as represented by block 206.

Approximate low frequency limit $f_{AL}$ is then determined at block 208 by identifying the lowest frequency one of the first plurality of amplitude values which is no more than 15 db (or 6 dB) below the peak value. Similarly, the approximate high frequency limit $f_{AH}$ is determined at block 208 by identifying the highest frequency one of the first plurality of amplitude values which is no more than 15 dB (6 dB) below the peak value.

At block 210, approximate average power 58 of signal 50 between the approximately low and high frequency limits is determined by summing each of the first plurality of amplitude values between these points and dividing by the total number of points. Subroutine Find Average Power ends at block 212, and such result is then input to block 108 of FIG. 5 as previously described.

Referring now to FIG. 7 in conjunction with FIG. 2, there is shown a logic flow diagram of subroutine Read Bandwidth represented by block 120 in the flow diagram of FIG. 5. At block 300, the lowest and highest frequency ones of the second plurality of amplitude values 62, 64 which are above the approximate average power level 58 from block 106 are determined. At block 302, it is determined whether the number of points between the lowest and highest points 62, 64 identified at block 300 is greater than two hundred. If not, a calculation is made at block 304 of the number of amplitude values to be used in subsequent averaging steps. The number of such averaging steps is equal to one-third of the total number of amplitude values between the points 62, 64 identified at block 300. If the total number of amplitude values between the points 62, 64 is greater than two hundred, then the number of amplitude values for averaging purposes is set equal to one hundred at block 306.

At block 308, a first subset 66 of the second plurality of amplitude values (the size of the subset being established at blocks 304 or 306) is averaged to provide a first, or low frequency, average signal level 70. First subset 66 begins at the lowest frequency point identified in block 300 and extends upward in frequency for the number of points determined in blocks 304 or 306. Similarly, a second subset 68 of amplitude values (the number determined at blocks 304 and 306, is identified, extending downward in frequency from the highest frequency one 64 of the second plurality of amplitude values. Second subset of amplitude values 68 is then averaged to obtain a second, or high frequency, average signal level 72.

At block 312, true frequency limits $f_L$, $f_H$ are determined, by identifying the lowest frequency one of the second plurality of amplitude values which is less than a predetermined amount below low frequency average signal level 70, and by identifying the highest frequency one of the second plurality of amplitude values which is more than the predetermined limit below high frequency average signal level 72. In the preferred embodiment, true frequency limits $f_L$ and $f_H$ are defined as the 3 dB bandwidth points; that is, the frequencies of those amplitude values which are 3 dB below the first and second average signal levels, respectively.

At block 314, maximum and minimum values 52, 74 of the second plurality of amplitude values are identified which are between the true frequency limits $f_L$ and $f_H$ previously determined at block 312.

At block 316, the specific amplitude values identified as $f_L$ and $f_H$ are converted to specific frequencies. At block 318, the variation of the signal between true frequency limits $f_L$ and $f_H$ is determined, based upon values calculated at block 314. Subroutine Read Bandwidth ends at block 320 with the results being displayed on input/output device 22.

It can thus be seen that a preferred embodiment of the invention in a first aspect includes a method for analyzing the bandwidth of a broad spectrum signal comprising the steps of estimating the high frequency limit and low frequency limit of the signal and obtaining a first plurality of amplitude values of the signal at frequencies extending from below the estimated low frequency limit to above the estimated high frequency limit. The method further includes the steps of determining approximate low and high frequency limits of the signal from the first plurality of amplitude values and obtaining a second plurality of amplitude values of the signal at frequencies extending from the approximate low frequency limit to the approximate high frequency limit. The method further includes the steps of averaging the amplitudes of a first subset of the second plurality of amplitude values to obtain a first average signal level and averaging the amplitudes of a second subset of the second plurality of amplitude values to obtain the second average signal level. Finally, the method includes the steps of determining a first true frequency limit of the signal equal to the frequency of one of the second plurality of amplitude values, the amplitude of which bears a predetermined relation with the first average single level, and determining a second true frequency limit of the signal equal to the frequency of one of the second plurality of amplitude values, the amplitude of which bears a predetermined relationship with the second average signal level.

In another aspect of a preferred embodiment of the invention, the invention includes apparatus for analyzing a broad spectrum signal having lower and upper skirts, comprising means for obtaining amplitude values of a plurality of components of the signal across the frequency range thereof. As embodied herein, the means for obtaining amplitude values comprises programmable spectrum analyzer 14. The invention further includes means for obtaining approximate high and low frequency limit values of the signal, means for averaging the amplitude values of a first subset of signal components extending upward in frequency from a point on the lower skirt to obtain a low frequency average signal level and for averaging the amplitude values of a second subset of the components extending downward in frequency from a point on the upper skirt to obtain a high frequency average signal level, and means for determining a true low frequency limit of the signal equal to the frequency of the lowest frequency one of the amplitude values, the amplitude of which is no more than a predetermined amount below the low frequency average signal level, and for determining a true high frequency limit of the signal equal to the frequency of the highest frequency one of the plurality of amplitude values, the amplitude of which is no more than the predetermined amount below the high frequency average signal level. As embodied herein the limit value obtaining means, the averaging means, and the true frequency limit determining means comprises computer system 18.

It will be apparent to those skilled in the art that the present invention provides methods and apparatus for broad spectrum signal analysis exhibiting high reliability and repeatability and which is suitable for use in a production environment. It will also be apparent to those skilled in the art that various modifications and variations can be made in methods and apparatus of the present invention disclosed herein without departing from the scope or spirit of the invention. Thus, it is intended that the present invention cover the modifications and variations of this invention provided they come within the scope of the appended claims and their equivalents.

We claim:

1. A method for analyzing the bandwidth of a broad spectrum signal, comprising the steps of:
estimating the high frequency limit and low frequency limit of said signal;

obtaining a first plurality of amplitude values of said signal at frequencies extending from below said estimated low frequency limit to above said estimated high frequency limit;

determining approximate low and high frequency limits of said signal from said first plurality of amplitude values;

obtaining a second plurality of amplitude values of said signal at frequencies extending from said approximate low frequency limit to said approximate high frequency limit;

averaging the amplitudes of a first subset of said second plurality of amplitude values to obtain a first average signal level, and averaging the amplitudes of a second subset of said second plurality of amplitude values to obtain a second average signal level;

determining a first true frequency limit of said signal equal to the frequency of one of said second plurality of amplitude values the amplitude of which bears a predetermined relation with said first average signal level; and determining a second true frequency limit of said signal equal to the frequency of one of said second plurality of amplitude values the amplitude of which bears a predetermined relationship with said second average signal level.

2. A method as recited in claim 1 wherein the step of averaging first and second subsets of said second plurality of amplitude values comprises averaging the amplitudes of a first subset of said second plurality of amplitude values in proximity to said approximate low frequency limit to obtain a low frequency average signal level, and averaging the amplitudes of a second subset of said second plurality of amplitude values in proximity to said approximate high frequency limit to obtain a high frequency average signal level.

3. A method as recited in claim 2 comprising the additional step of determining the approximate average power of said first plurality of amplitude values between said approximate low and high frequency limits, and wherein the step of averaging first and second subsets of said second plurality of amplitude values comprises averaging the amplitudes of a first subset of said second plurality of amplitude values extending upward in frequency from the lowest frequency one of said second plurality of amplitude values which is equal to a predetermined amount less than said approximate average power to obtain a low frequency average signal level, and averaging the amplitudes of a second subset of said second plurality of amplitude values extending downward in frequency from the highest frequency one of said second plurality of amplitude values which is equal to said predetermined amount less than said average power to obtain a high frequency average signal level.

4. A method as recited in claim 1 wherein the step of determining approximate low and high frequency limits of said signal comprises the substeps of determining the peak amplitude of said first plurality of amplitude values and selecting as said approximate low and high frequency limits the lowest frequency and highest frequency amplitude values, respectively, which are a second predetermined amount below said peak amplitude.

5. A method as recited in claim 4 wherein said second predetermined amount is set equal to a first value when said peak amplitude exceeds the lowest frequency one of said second plurality of amplitudes by less than a third predetermined amount and said second predetermined amount is set equal to a second value when said peak amplitude exceeds the lowest frequency one of said second plurality of amplitudes by more than said third predetermined amount.

6. A method as recited in claim 5 wherein said first value is less than said second value.

7. A method as recited in claim 2 wherein the size of said first and second subsets is to a fixed number of amplitude values if the number of said second plurality of amplitude values above said approximate average power is equal to or greater than a fourth predetermined amount and wherein the size of said first and second subsets is equal to a fraction of the number of said second plurality of amplitude values above said approximate average power if said second plurality of amplitudes above said approximate average power is equal to or greater than said fourth predetermined amount.

8. A method as recited in claim 1 comprising the additional step of determining a measure of the amplitude variation of said signal by determining the difference between the maximum and minimum of said second plurality of amplitude values between said true low frequency limit and said true high frequency limit.

9. A method as recited in claim 1 comprising the additional steps of computing average power of said first plurality of amplitude values after obtaining said first plurality of amplitude values, and terminating the analysis if said average power is less than a fifth predetermined amount.

10. A method for analyzing the bandwidth of a broad spectrum signal, comprising the steps of:

estimating the high frequency limit and low frequency limit of said signal;

obtaining a first plurality of amplitude values of said signal at frequencies extending from below said estimated low frequency limit to above said estimated high frequency limit;

determining approximate low and high frequency limits of said signal from said first plurality of amplitude values;

calculating an approximate average power equal to the average of said first amplitude values between said approximate low and high frequency limits;

obtaining a second plurality of amplitude values of said signal at frequencies extending from said approximate low frequency limit to said approximate high frequency limit;

averaging the amplitudes of a first subset of said second plurality of amplitude values extending upward in frequency from the lowest frequency one of said second amplitude values equal to or greater than said approximate average power minus a predetermined amount to obtain a low frequency average signal level, and averaging the amplitudes of a second subset of said second plurality of amplitude values extending downward in frequency from the highest frequency one of said amplitude values equal to or greater than said approximate average power minus a predetermined amount to obtain a high frequency average signal level;

determining a true low frequency limit of said signal equal to the frequency of the lowest frequency one of said second plurality of amplitude values the amplitude of which is no more than a second predetermined amount below said low frequency average signal level; and determining a true high frequency limit of said signal equal to the frequency of the highest frequency one of said second plurality of amplitude values the amplitude of which is no more than said second predetermined amount below said high frequency average signal level.

11. A method for analyzing the bandwidth of a broad spectrum signal having upper and lower skirts, comprising the steps of:

obtaining amplitude values of a plurality of frequency components of said signal across the frequency range of said signal;

determining approximate low and high frequency limits of said signal;

averaging a first subset of said amplitude values extending upward in frequency from a point on said lower skirt to obtain a low frequency average signal level, and averaging a second subset of said second plurality of amplitude values extending downward in frequency from a point on said upper skirt to obtain a high frequency average signal level; and determining a true low frequency limit of said signal equal to the frequency of the lowest frequency one of said amplitude values the amplitude of which is no more than a predetermined amount below said low frequency average signal level, and for determining a true high frequency limit of said signal equal to the frequency of the highest frequency one of said amplitude values the amplitude of which is no more than said predetermined amount below said high frequency average signal level.

12. Apparatus for analyzing a broad spectrum signal having upper and lower skirts, comprising:

means for obtaining amplitude values of a plurality of components of said signal across the frequency range thereof;

means for obtaining approximate high and low frequency limit values of said signal;

means for averaging the amplitude values of a first subset of said components extending upward in frequency from a point on said lower skirt to obtain a low frequency average signal level, and for averaging the amplitude values of a second subset of said components extending downward in frequency from a point on said upper skirt to obtain a high frequency average signal level; and means for determining a true low frequency limit of said signal equal to the frequency of the lowest frequency one of said amplitude values the amplitude of which is no more than a predetermined amount below said low frequency average signal level and for determining a true high frequency limit of said signal equal to the frequency of the highest frequency one of said plurality of amplitude values the amplitude of which is no more than said predetermined amount below said high frequency average signal level.

* * * * *